US 6,704,672 B2

(12) United States Patent
Weickert et al.

(10) Patent No.: US 6,704,672 B2
(45) Date of Patent: Mar. 9, 2004

(54) METHOD FOR CONTROLLING THE STATUS OF AN INTERNAL MEMORY (BUFFER) AND CONTROL DEVICE FOR SAME

(75) Inventors: Ronald Weickert, Stutensee (DE); Rainer Kopf, Straubenhardt (DE)

(73) Assignee: Ahead Software GmbH (DE)

( * ) Notice: Subject to any disclaimer, the term of this patent is extended or adjusted under 35 U.S.C. 154(b) by 132 days.

(21) Appl. No.: 09/971,459

(22) Filed: Oct. 5, 2001

(65) Prior Publication Data

US 2002/0128788 A1 Sep. 12, 2002

(30) Foreign Application Priority Data

Mar. 12, 2001 (DE) .......................................... 101 12 939

(51) Int. Cl.⁷ ............................................... G06F 12/00
(52) U.S. Cl. .......................................... 702/79; 711/100
(58) Field of Search ............................... 702/79, 80, 81, 702/84, 35, 96, 125, 145, 176, 183, 189; 711/100, 147, 167

(56) References Cited

U.S. PATENT DOCUMENTS

| | | | | |
|---|---|---|---|---|
| 4,410,917 A | * | 10/1983 | Newdoll et al. ............... | 360/15 |
| 4,410,942 A | * | 10/1983 | Milligan et al. ............... | 710/61 |
| 5,720,030 A | * | 2/1998 | Kamihara et al. ............. | 714/42 |
| 6,236,804 B1 | * | 5/2001 | Tozaki et al. .................. | 386/95 |
| 6,351,287 B1 | * | 2/2002 | Sakaegi et al. ............... | 348/372 |
| 6,470,432 B2 | * | 10/2002 | Ozawa et al. ................. | 711/167 |
| 6,535,953 B1 | * | 3/2003 | Kakiuchi ....................... | 711/112 |
| 6,549,976 B2 | * | 4/2003 | Ando et al. ................... | 711/112 |
| 6,557,126 B1 | * | 4/2003 | Kelly ............................ | 714/708 |

* cited by examiner

*Primary Examiner*—Marc S. Hoff
*Assistant Examiner*—Edward Raymond
(74) *Attorney, Agent, or Firm*—R W Becker & Associates; R W Becker

(57) ABSTRACT

A method and device are provided for controlling the status of an internal memory of a recorder for data carriers for compensating for differences in speed between a data processing/transmitting device and the recorder. At least in the working phase of the recorder, the time is measured, the number of issued record commands is counted, and between checks and/or after a check of the status of the internal memory, an actual status is determined after a predetermined or predeterminable time or time intervals since the last check, recording speed, amount of internal memory, and number of record commands issued.

11 Claims, No Drawings

METHOD FOR CONTROLLING THE STATUS OF AN INTERNAL MEMORY (BUFFER) AND CONTROL DEVICE FOR SAME

BACKGROUND OF THE INVENTION

The present invention relates to methods for controlling the status of an internal memory (buffer) of a recorder for data carriers for compensating for differences in speed between a data-processing/transmitting device and the recorder, and furthermore relates to devices for controlling the status of an internal memory (buffer) for a recorder for data carriers for compensating for differences in speed between a data-processing/transmitting device and the recorder.

In known software programs for inscribing data carriers, a query command is sent after each record command, after every second record command, or after every third record command. This query command determines the amount of internal memory in use. The result is either provided to the user or is used to control the recorder. The query command takes a few milliseconds, depending on the interface. It can happen that the query takes too much time and the writing process therefore suffers an error so that there is a so-called buffer underrun. The internal memory (buffer) of the recorder cannot continue with its task due to a lack of data and must interrupt the inscription of the data carrier. Normally the data carrier in question becomes unusable when such an error occurs, even if a few recorders or programs attempt to close the affected session automatically in order at least to make accessible the data that have already been written.

Additional methods (see also "Burn-Proof" or "Just Link") attempt to prevent buffer underruns. The laser for recording the data carrier is stopped if the quantity of data in the internal memory drops below a certain level. This level is, for instance, 10% in use; thus 90% of the internal memory capacity is empty. The writing or recording process is not re-started until the amount of memory in use exceeds a certain level. This can occur as often as desired so that the buffer underrun is avoided.

It is an object of the present invention to provide a method and a device for determining the status of the internal memory of a recorder for data carriers at any time and thus placing less stress on the transmission bus.

SUMMARY OF THE INVENTION

The method of the present invention is characterized by the steps, at least in the working phase of the recorder, of measuring the time, counting the number of issued record commands, and between checks and/or after a check of the status of the internal memory, determining an actual status after a predetermined or predeterminable time, or after predetermined or predeterminable time intervals, since the last check, recording speed, amount of internal memory, and number of record commands issued.

The device of the present invention is characterized primarily by a time measuring device for at least the working phase of the recorder; a device for counting the number of issued record commands; and a device for determining, between checks and/or after a check of the status of the internal memory, the actual status after a predetermined or predeterminable time, or after predetermined or predeterminable time intervals, since the last check, including the recording speed, the amount of internal memory, and the number of record commands issued, wherein the time measuring device, the device for counting, and the device for determining are all components of a control of the recorder.

The advantages achieved with the invention are in particular that the amount of used internal memory (buffer) of a recorder, in particular of a CD (compact disc)/DVD (digital versatile disk)-recorder, CD/DVD writer, or CD/DVD burner, is known for such data carriers. This amount can be provided to the user in order to provide him more information about the burn process, and/or can be used to control the recording process (burn process).

The following methods are among those used for inscribing these data carriers:

Track-at-once, whereby the recording laser beam is turned off after each written track and is turned on again when recording a new track so that introductory and concluding blocks (run-in/run-out blocks) are recorded between the individual tracks;

Disc-at-once, whereby a plurality of tracks are recorded without turning the laser beam off and the data carrier is automatically finalized so that no additional tracks can be added;

Session-at-once, whereby a complete session (one or more tracks of any desired type, data or audio, comprising lead-in, program area, and lead-out) is recorded in one pass and one data carrier can be provided with a plurality of sessions (multi-session); and, Packet-writing, whereby substantially smaller blocks are recorded compared to the aforesaid method.

When using these methods, the data to be recorded, for instance video, audio, programs, databases, etc., are transmitted in real time to the recorder, which then records the data onto the CD or DVD.

Prior to recording, the recorder stores the data transmitted via interface, for instance IDE, SCSI, IEEE1394, or USB, in the internal memory (buffer). The data from this internal memory are stored on the data carrier. If the unused internal memory in the recorder approaches the size of the overall internal memory, that is, there are increasingly fewer data in this internal memory, a so-called buffer underrun becomes more and more probable. If the internal memory is empty, the laser aborts its recording process and the buffer underrun has occurred. This renders the data carrier, or at least the track that has been written, unusable.

In many known software programs for recording to the data carrier, after each record command, after every other record command, or after every second or every third record command, the program sends a command querying how much of the internal memory is in use in order then to provide this information to the user or to control the recording process as appropriate. The query command takes a few milliseconds, depending on the interface. It can happen that the query takes too much time and the writing therefore suffers an error so that there is a so-called buffer underrun. However, this query is essential, because otherwise the user does not obtain any information or it is no longer possible for the recording software to control the recording process.

The essential advantage of the inventive solutions is that at least in the working phase of the recorder, the time is measured, the number of record commands issued are counted, and, between checks and/or after a check of the status of the internal memory, determining a current status after a pre-determined or pre-determinable time, or pre-determined or pre-determinable time intervals, since the previous check, the recording speed, the amount of internal memory, and the number of record commands issued.

This means that the status of the internal memory is read out less frequently, substantially reducing the risk of a buffer underrun occurring.

The inventive solutions can furthermore be employed in recorders that have methods for avoiding the buffer underrun (for instance, "Burn-Proof", "Just Link"). Although no buffer underrun occurs during these methods, when the data in the internal memory drop below a threshold, the recording process is stopped for a few seconds, increasing the total recording time.

One simple option for calculating the status of the amount of internal memory currently in use is to use the equation:

$$Xnew=Xold+(A*B)-(t*Y),$$

where

Xnew is the amount of memory currently in use, in bytes
Xold is the amount of memory in use when last checked, in bytes
A is the number of blocks transmitted since Xold
B is the block size of blocks transmitted, in bytes
t is the time in seconds, and
Y is the burn speed in bytes per second.

When this equation is applied, it is possible to read out the status of the internal memory at longer intervals without incurring a significant loss of information about the status. In one variant this could occur due to a one-time reading out at the beginning of the recording process, whereby the following conditions are merely calculated.

In accordance with further developments of the present invention, the status of the internal memory is read out at regular time intervals, whereby the newly read-out value X is used, as the amount of internal memory of the recorder in use, for a new reference value. This makes it possible to provide a continuous and substantially more accurate status to the user.

The effect of this continuous approximation to the actual status of the internal memory is that the command for reading out the internal memory is called up less frequently and yet knowledge about the status of the internal memory is better. The load on the interfaces is reduced due to fewer commands for determining the status of the internal memory, and the recorder can transmit more record commands more rapidly while fewer buffer underruns occur.

In a further development of the present invention, whereby the time for performing the "read out amount of buffer in use" command is measured, and when a predeterminable period of time has been exceeded this command is called up even less frequently and in between the amount of memory in use is calculated using the equation, all of which leads to recorders that require a particularly long time for this command so that the opportunity for the buffer underrun is reduced even further.

If the internal memory is in use and therefore cannot receive any additional data, but if additional data are nevertheless still sent from the data-processing/transmitting device, these data are either refused or the period for recording the data is substantially greater. The data must be re-sent or the recorder waits until the internal memory has enough room to receive these data. Both instances lead to an increase in the period for recording to the data carrier. The transmission of data is blocked during these processes and no other functions can take place during this time. This is avoided by further developments of the present invention, whereby the internal memory of the recorder in use is less than or equal to 100% of the device acquiring the data in the data-processing/transmitting device.

The inventive control device is particularly advantageous in accordance with a further development of the invention for data carriers in the form of CDs (compact discs) or DVDs (digital versatile disks). Recorders for these data carriers are advantageously a CD burner, a CD burner with read mode, a DVD burner, or a DVD burner with read mode.

DESCRIPTION OF A PREFERRED EMBODIMENT

One exemplary embodiment of the invention is described in more detail in the following.

The exemplary embodiment is used to describe in greater detail one method for controlling the status of an internal memory (buffer) of a recorder for data carriers for compensating for differences in speed between a data-processing/transmitting device and the recorder, and a device for controlling the status of an internal memory (buffer) for a recorder for data carriers for compensating for differences in speed between a data-processing/transmitting device and the recorder.

The data-processing/transmitting device is a computer having a plurality of memories. One of these memories is, for instance, a hard drive on which are stored the data and associated processing programs. One of these programs administers the internal memory (buffer) of the recorder.

The data carrier is either a CD (compact disk) or a DVD (digital versatile disk). The contents of these data carriers can be computer programs, text, images, graphics, audio, video, or movies. Recorders for these data carriers can be CD burners, CD burners with read mode, DVD burners, or DVD burners with read mode.

The recorder works using the track-at-once, disc-at-once, session-at-once, or packet-writing method. These methods have been described in the foregoing. In these recording methods, the data to be recorded are transferred in real time to the recorder, which then records the data on the CD or DVD.

Prior to the recording process, the data transferred via an interface for instance IDE, SCSI, IEEE1394, or USB, are stored in the internal memory (buffer) of the recorder in order to compensate for differences in speed between the different devices. These devices are, for instance, a computer having a recorder. The computer simultaneously assumes control of the recorder using special software. Then these data in the internal memory are stored on the data carrier.

The internal memory provides protection against intermediate faults or interruptions in the data stream supplied by the device processing and transmitting the data. The data are supplied by the hard drive in the computer to the internal memory of the recorder. The consequence of longer faults in the data stream that cannot be captured by the internal memory of the recorder is called buffer underrun. The internal memory is empty, the recorder cannot continue its task due to a lack of data, and it must abort the process of inscribing to the data carrier. This leads to a situation in which at least the written track or the entire data carrier becomes unusable. In order to circumvent the buffer underrun, it is possible to use the software to provide a command querying the status of the internal memory (recorder buffer). The amount of the internal memory of the recorder that is in use is therefore a variable that is of interest. Among other things, this variable can be provided to the user in order to provide more information about the burn process, or this variable can be used to control the burn process. Normally the burn program therefore sends a query command about the amount of internal memory in use after each, after every second, or after every third record command in order either to provide this information to the user or to control the writing process as appropriate. Each command about the status of the internal memory takes a few milliseconds, depending on recorder and interface. It can happen that querying the status of the internal memory takes too much time and the recording process therefore suffers an error so that there is a buffer underrun.

In order to reduce the frequency of this occurrence, the status of the internal memory is read out less frequently, and in order to determine the status between the intervals, the status is calculated.

For this to happen, at least during the working phase of the recorder, the time is measured using a timer device in the computer, the number of record commands are counted in a device in the computer, and the current status between checks and/or after a check of the status of the internal memory is calculated in a device in the computer after a pre-determined or pre-determinable time or after pre-determined or pre-determinable time intervals since the most recent check and using the recording speed, the size of the internal memory, and the number of record commands issued. These aforementioned devices are realized with the aid of software and are part of the control of the recorder. The control itself is in turn a part of the computer.

The status of the internal memory is calculated in the control using the equation:

$$Xnew = Xold + (A*B) - (t*Y),$$

where

Xnew is the amount of memory currently in use, in bytes
Xold is the amount of memory in use when last checked, in bytes
A is the number of blocks transmitted since Xold
B is the block size of blocks transmitted, in bytes
t is the time in seconds, and
Y is the burn speed in bytes per second This means that the Xnew variable is re-calculated instead of being queried continuously.

This continuous approximation of the actual status means that the command for reading out the internal memory is called up much less frequently and yet knowledge of the status is substantially better. Before, the status was only sent after every second record command, but now it can be estimated after every record command. The load on the interfaces is substantially reduced because there are fewer commands to determine the status, and the recorder can transmit more record commands more rapidly, whereby buffer underruns occur less frequently.

In embodiments in which buffer underruns are prevented by special methods, the burn process is interrupted for a period of time and at least the overall duration of the burn process is longer. Using the inventive solutions can save a substantial amount of time so that the overall duration of the burn process can be reduced in these embodiments.

In one additional embodiment of the exemplary embodiment, the time that performing the "read out amount of buffer in use" command lasts is measured. If the command takes more than a certain amount of time, it is called up even less frequently and the calculation is performed in the meantime as above. This then leads to recorders that take a particularly long time for this command, so that the risk of a buffer underrun is reduced even further.

In one additional embodiment of the exemplary embodiment, a device that acquires the data for the internal memory and that is in the device that processes and transmits the data can be used to ensure that the amount of memory in use in the internal memory is less than or equal to 100%, preferably equal to or greater than 80% and less than or equal to 100%.

The specification incorporates by reference the disclosure of German priority document 101 12 939.4 of 12 March 2001.

The present invention is, of course, in no way restricted to the specific disclosure of the specification, but also encompasses any modifications with the scope of the appended claims.

What we claim is:

1. A method of controlling the status of an internal memory of a recorder for data carriers for compensating for differences in speed between a data processing/transmitting device and the recorder, including the steps, during the data recording activity which comprises the working phase of the recorder, of:

measuring the time;
counting the number of issued record commands; and
between checks and/or after a check of the status of the internal memory, estimating an actual status in dependence upon either a predetermined or predeterminable time, or after predetermined or predeterminable time intervals, since the last check, and taking into account recording speed, amount of internal memory of the recorder, and number of record commands issued.

2. A method according to claim 1, wherein the status of the internal recording is calculated pursuant to the equation:

$$Xnew = Xold + (A*B) - (t*Y),$$

where

Xnew is the amount of memory currently in use, in bytes
Xold is the amount of memory in use when last checked, in bytes
A is the number of blocks transmitted since Xold
B is the block size of blocks transmitted, in bytes
t is the time in seconds, and
Y is the burn speed in bytes per second.

3. A method according to claim 2, wherein at regular time intervals the value X, as the used amount of the internal memory of the recorder, is newly read-out, and is used as the new reference value.

4. A method according to claim 3, wherein a time for carrying out the command "read out amount of buffer in use" is measured, thereafter the command is called up after a greater and/or predeterminable period of time, and in between the amount of memory is calculated pursuant to the equation:

$$Xnew = Xold + (A*B) - (t*Y),$$

where

Xnew is the amount of memory currently in use, in bytes
Xold is the amount of memory in use when last checked, in bytes
A is the number of blocks transmitted since Xold
B is the block size of blocks transmitted, in bytes
t is the time in seconds, and
Y is the burn speed in bytes per second.

5. A method according to claim 4, wherein data from said data processing and transmitting device is read by the internal memory in such a way that the memory space of the internal memory used is less than or equal to 100%.

6. A device for controlling the status of an internal memory of a recorder for data carriers for compensating for differences in speed between a data processing/transmitting device and the recorder, said device comprising:
- a time measuring device for measuring the time during the data recording activity which comprises the working phase of the recorder;
- a device for counting the number of issued record commands; and
- a device for estimating, between checks and/or after a check of the status of the internal memory, the actual status in dependence upon a predetermined or predeterminable time, or after predetermined or predeterminable time intervals, since the last check, including the recording speed, the amount of internal memory, and the number of record commands issued, wherein said time measuring device, said device for counting, and said device for determining are all components of a control of said recorder.

7. A device according to claim 6, wherein said components of said control of said recorder are coupled with one another by means of software implemented in said control, and wherein the status of the internal memory is calculated in said control using the equation:

$$Xnew=Xold+(A*B)-(t*Y),$$

where
- Xnew is the amount of memory currently in use, in bytes
- Xold is the amount of memory in use when last checked, in bytes
- A is the number of blocks transmitted since Xold
- B is the block size of blocks transmitted, in bytes
- t is the time in seconds, and
- Y is the burn speed in bytes per second.

8. A device according to claim 7, wherein a value X that is read-out at regular time intervals, as the amount of internal memory of the internal memory of the recorder in use, is a new reference value.

9. A device according to claim 8, wherein a device that reads the data to the internal memory is integrated into said data processing and transmitting device, and wherein said reading device ensures that the memory space of the internal memory that is used is less than or equal to 100%.

10. A device according to claim 9, wherein said data carrier is a CD or a DVD, and wherein said recorder for said data carrier is a CD burner, a CD burner with read mode, a DVD burner, or a DVD burner with read mode.

11. A method of controlling the status of an internal memory of a recorder for data carriers for compensating for differences in speed between a data processing/transmitting device and the recorder, comprising:
- during the data recording activity which comprises the working phase of the recorder, measuring the time and reading out the current actual used amount of the internal memory of the recorder after the passage of a predetermined time interval; and
- following the reading out the current actual used amount of the internal memory of the recorder, and after the passage of another predetermined time interval, estimating the amount of internal memory of the recorder taking into account recording speed, the number of blocks transmitted since reading out the current actual used amount of the internal memory of the recorder, and the block size of blocks transmitted.

* * * * *

UNITED STATES PATENT AND TRADEMARK OFFICE
CERTIFICATE OF CORRECTION

PATENT NO.    : 6,704,672 B2                                                Page 1 of 1
DATED         : March 9, 2004
INVENTOR(S)   : Weickert et al.

It is certified that error appears in the above-identified patent and that said Letters Patent is hereby corrected as shown below:

<u>Title page,</u>
Item [75], should read as follows:
-- [75] Inventors: Roland Weickert, Stutensee (DE); Rainer Kopf, Straubenhardt (DE) --.

Signed and Sealed this

Twenty-ninth Day of June, 2004

JON W. DUDAS
*Acting Director of the United States Patent and Trademark Office*